(12) United States Patent
Yamawaku et al.

(10) Patent No.: US 10,325,758 B2
(45) Date of Patent: *Jun. 18, 2019

(54) PLASMA PROCESSING APPARATUS

(71) Applicant: Tokyo Electron Limited, Tokyo (JP)

(72) Inventors: Jun Yamawaku, Yamanashi (JP);
Tatsuo Matsudo, Yamanashi (JP);
Chishio Koshimizu, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/933,911

(22) Filed: Nov. 5, 2015

(65) Prior Publication Data
US 2016/0126063 A1    May 5, 2016

(30) Foreign Application Priority Data
Nov. 5, 2014 (JP) .................................. 2014-225241

(51) Int. Cl.
*H01J 37/32* (2006.01)

(52) U.S. Cl.
CPC ..... *H01J 37/3211* (2013.01); *H01J 37/32119* (2013.01); *H01J 37/32183* (2013.01); *H01J 37/32651* (2013.01)

(58) Field of Classification Search
CPC .............. H01J 37/321; H01J 37/3211; H01J 37/32174; H01J 37/32183; H01J 2237/327; H05H 2001/4652; H05H 2001/466; H05H 2001/467; H05H 1/46; H05H 2001/4667; H01F 38/14
(Continued)

(56) References Cited

U.S. PATENT DOCUMENTS 5,731,565 A * 3/1998 Gates .................... H01J 37/321
156/345.48
6,164,241 A * 12/2000 Chen .................... H01J 37/321
118/723 I
(Continued)

FOREIGN PATENT DOCUMENTS

JP    H10-150032 A    6/1998
JP    2009-016837 A   1/2009
(Continued)

*Primary Examiner* — Alexander H Taningco
*Assistant Examiner* — Renan Luque
(74) *Attorney, Agent, or Firm* — Fenwick & West LLP

(57) ABSTRACT

A plasma processing apparatus includes a plasma generation unit configured to convert a processing gas supplied into a processing chamber into plasma by an inductive coupling. The plasma generation unit includes a first high frequency antenna formed of a vortex coil arranged adjacent to the processing chamber through a dielectric window, a second high frequency antenna having a natural resonant frequency and formed of a vortex coil arranged at an outer or inner peripheral side of the first high frequency antenna, and an impedance adjustment unit for adjusting a resonant frequency of a circuit viewed from the high frequency power supply toward the first high frequency antenna. The circuit viewed from the high frequency power supply toward the first high frequency antenna is configured to have two resonant frequencies depending on adjustment of the impedance adjustment unit when a frequency of high frequency power is changed.

23 Claims, 16 Drawing Sheets

(58) Field of Classification Search
USPC ........ 156/345.48, 345.49; 118/723 I, 723 IR, 118/723 AN; 315/111.51
See application file for complete search history.

(56) References Cited

U.S. PATENT DOCUMENTS

| | | | | |
|---|---|---|---|---|
| 6,441,555 B1* | 8/2002 | Howald | ................ | H01J 37/321 |
| | | | | 118/723 I |
| 8,551,289 B2 | 10/2013 | Nishimura et al. | | |
| 2002/0185228 A1* | 12/2002 | Chen | .................... | H01J 37/321 |
| | | | | 156/345.48 |
| 2005/0183668 A1* | 8/2005 | Lee | ..................... | H01J 37/321 |
| | | | | 118/723 I |
| 2011/0094996 A1* | 4/2011 | Yamazawa | ............ | H01J 37/321 |
| | | | | 216/68 |
| 2011/0094997 A1* | 4/2011 | Yamazawa | ............ | H01J 37/321 |
| | | | | 216/68 |
| 2012/0031560 A1* | 2/2012 | Koshimizu | ....... | H01J 37/32623 |
| | | | | 156/345.33 |
| 2012/0247679 A1* | 10/2012 | Yamazawa | ............ | H01J 37/321 |
| | | | | 156/345.48 |
| 2015/0097480 A1* | 4/2015 | Chung | ................. | H01J 37/3211 |
| | | | | 315/34 |
| 2016/0013661 A1* | 1/2016 | Kurs | ....................... | H02J 50/70 |
| | | | | 307/104 |

FOREIGN PATENT DOCUMENTS

| | | |
|---|---|---|
| JP | 2010-258324 A | 11/2010 |
| JP | 2012-209468 A | 10/2012 |
| JP | 5227245 | 7/2013 |
| KR | 10-0292439 B1 | 6/2001 |
| KR | 10-2010-0118545 A | 11/2010 |
| KR | 10-2011-0046349 A | 5/2011 |
| WO | 2014-073395 A1 | 5/2014 |

* cited by examiner

C2: SMALL

C2: LARGE

PLASMA PROCESSING APPARATUS

CROSS-REFERENCE TO RELATED APPLICATIONS

This application claims priority to Japanese Patent Application No. 2014-225241 filed on Nov. 5, 2014, the entire contents of which are incorporated herein by reference.

FIELD OF THE INVENTION

The present invention relates to a plasma processing apparatus which performs a process on a substrate by exciting a processing gas.

BACKGROUND OF THE INVENTION

As one of the semiconductor manufacturing processes, there is a plasma process such as an etching process, a film forming process or the like which uses plasma of a processing gas. For example, in a single-subatrate plasma processing apparatus, it is required to properly control the plasma density distribution to become appropriate in a plane direction of a substrate depening on a process type, specifically based on a structure in a processing chamber, or in consideration of in-plane deviation of the substrate plane in a post-porcess. Therefore, the requirement is not limited to making the plasma density distribution uniform in an entire plane of the substrate and may include making the plasma density distribution different between a central portion and a periphery portion of the substrate.

As one of the plasma generating method in the plasma processing apparatus, there is a method in which, e.g., a high frequency power is supplied to an antenna and an induced electric field is generated in a processing chamber to excite a processing gas. For example, Japanese Patent Application Publication No. 5227245 (paragraphs [0055]-[0062], FIGS. 3 to 6) discloses a configuration in which a coil-shaped inner antenna and a coil-shaped outer antenna formed concentric to the inner antenna are provided as a high frequency antenna which outputs a high frequency, and each of the antennas resonates at a frequency of ½ wavelength of the high frequency. In this plasma processing apparatus, a circular electric field is each formed by each antenna, and thus in-plane distribution of the plasma density can be very delicately adjusted. However, a high frequency power supply needs to be provided at each of the inner antenna and the outer antenna.

SUMMARY OF THE INVENTION

In view of the above, the present invention provides a technique for adjusting in-plane distribution of plasma density in a plasma processing apparatus which performs a process on a substrate by generating plasma by using a high frequency antenna.

In accordance with an aspect, there is provided a plasma processing apparatus for performing a plasma process on a substrate in a processing chamber, the plasma processing apparatus including: a mounting table on which the substrate is mounted, the mounting table being provided in the processing chamber; a processing gas supply unit configured to supply a processing gas into the processing chamber; an exhaust unit configured to vacuum-exhaust an inside of the processing chamber; and a plasma generation unit arranged opposite to the mounting table and configured to convert the processing gas supplied into the processing chamber into plasma by an inductive coupling.

The plasma generation unit includes: a first high frequency antenna formed of a vortex coil arranged adjacent to the processing chamber through a dielectric window, one end of the first high frequency antenna being connected to a high frequency power supply and the other end thereof being directly grounded or grounded through a capacitor; a second high frequency antenna having a natural resonant frequency and formed of a vortex coil arranged at an outer peripheral side or an inner peripheral side of the first high frequency antenna when the first high frequency antenna is viewed from above, one end of the second high frequency antenna being an open end or being grounded and the other end thereof being an open end; a shield member that surrounds a space where the first high frequency antenna is arranged; and an impedance adjustment unit including a variable capacitor for adjusting a resonant frequency of a circuit viewed from the high frequency power supply toward the first high frequency antenna.

The circuit viewed from the high frequency power supply toward the first high frequency antenna is configured to have a first resonant frequency and a second resonant frequency depending on adjustment of the impedance adjustment unit when a frequency of high frequency power is changed.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with respect to the accompanying drawings.

Figure 1:
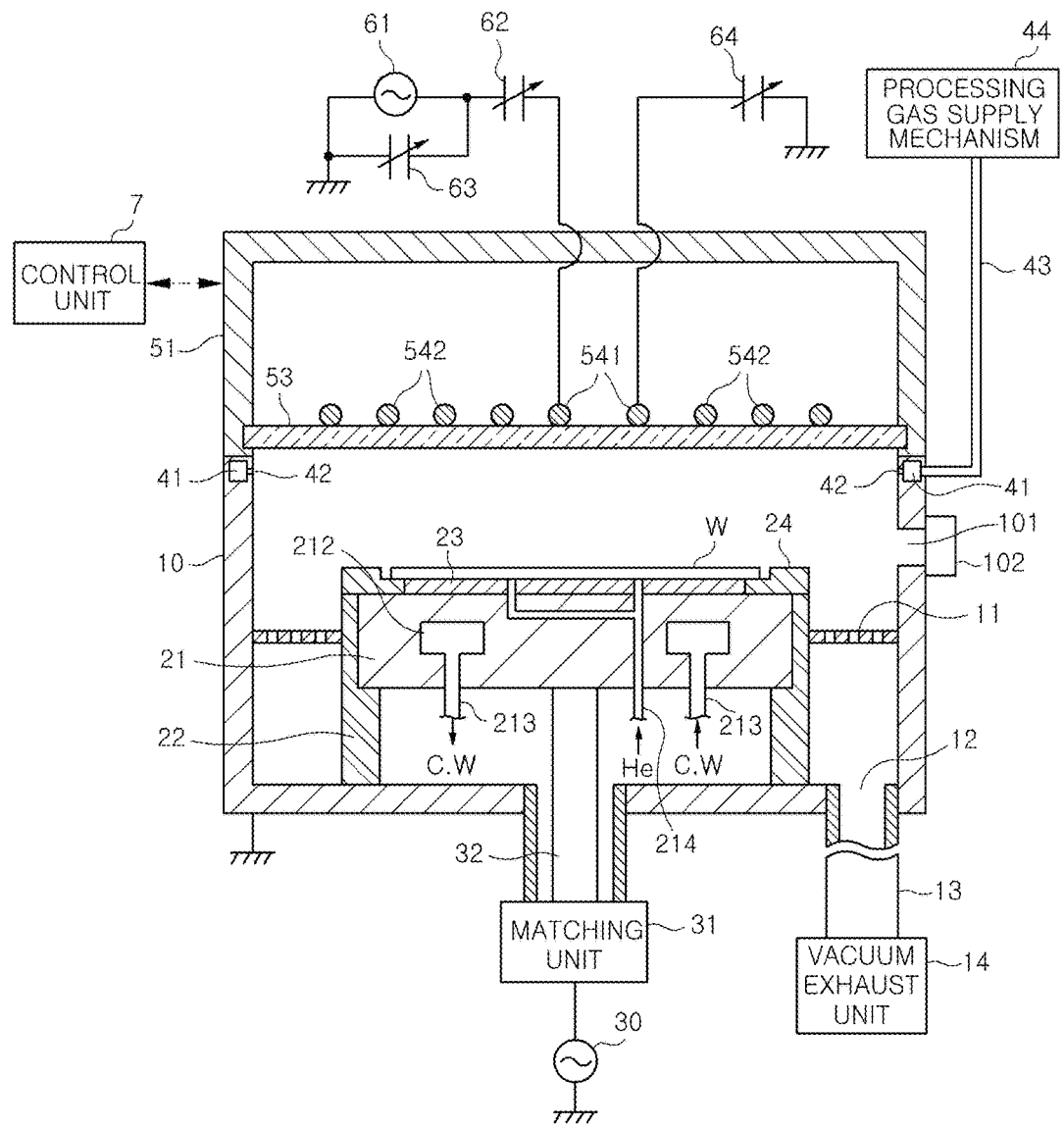
FIG. 1 is a vertical sectional side view of a plasma processing apparatus in accordance with a first embodiment of the present invention.

A plasma processing apparatus in accordance with a first embodiment of the present invention will be described. FIG. 1 shows an example in which a plasma processing apparatus of the present invention is applied to a plasma etching apparatus for performing an etching of a wafer W that is a substrate to be processed.

The plasma etching apparatus includes a grounded processing chamber 10 made of a conductive material such as aluminum, stainless steel or the like. A loading/unloading port 101 that is opened and closed by a gate valve 102 and through which the wafer W is loaded and unloaded is provided at a sidewall of the processing chamber 10.

At a central portion of the lower side in the processing chamber 10, there is provided a disk-shaped susceptor 21 serving as a mounting table on which a wafer W to be processed is mounted, and also serving as an electrode for attracting ions in plasma (an electrode for bias). The susceptor 21 is supported by a cylindrical susceptor support 22 made of an insulating material and the susceptor 21 is connected to a high frequency power supply 30 for bias through a power feed rod 32 and a matching unit 31. The high frequency power supply 30 supplies a high frequency power of, e.g., 13.56 MHz.

An electrostatic chuck 23 for holding the wafer W with an electrostatic attractive force is provided on the top of the susceptor 21. A focus ring 24 which surrounds the periphery of the wafer W is arranged at the outer side of the electrostatic chuck 23 in a diametric direction.

A coolant path 212 through which a coolant, e.g., cooling water flows to control a temperature of the wafer W is provided in the susceptor 21. The coolant path 212 is connected to a chiller unit (not shown) through a line 213, and temperature-controlled cooling water is supplied from the chiller unit. A gas supply line 214 through which a heat transfer gas, e.g., He gas is supplied to between the electrostatic chuck 23 and the wafer W is provided in the susceptor 21. The gas supply line 214 penetrates through the electrostatic chuck 23 and a leading end of the gas supply line 214 is opened at the top surface of the electrostatic chuck 23.

In addition, elevating pins (not shown) for transferring and receiving the wafer W to and from an external transfer arm (not shown) is provided to vertically penetrate through the susceptor 12 and protrude beyond and retreat below from the surface of the electrostatic chuck 23.

An annular baffle plate 11 formed of a perforated plate having a plurality of through-holes are formed is provided between the susceptor support 22 and an inner wall surface of the processing chamber 10. At the bottom of the processing chamber 10, an exhaust port 12 is formed below the baffle plate 11. The exhaust port 12 is connected to a vacuum exhaust mechanism 14 through an exhaust line 13. The exhaust port 12, the exhaust line 13 and the vacuum exhaust mechanism 14 constitute an exhaust unit.

In the side wall of the processing chamber 10, a processing gas supply passageway 41 is formed, above the loading/unloading port 101, along the circumferential direction of the side wall. At an inner wall surface of the processing chamber 10 corresponding to a region where the processing gas supply passageway 41 is formed, a plurality of processing gas supply holes 42 is formed at intervals and communicates with the processing gas supply passageway 41. Connected to the processing gas supply passageway 41 is a processing gas supply mechanism 44 for supplying through a processing gas supply line 43 a processing gas that is an etching gas such as $CF_4$ gas, $C_4F_8$ gas, chlorine gas or the like. The processing gas supply passageway 41, the processing gas supply holes 42, the processing gas supply line 43 and the processing gas supply mechanism 44 constitute a processing gas supply unit of the present embodiment.

A dielectric window 53 formed of a dielectric such as quartz plate or the like is provided airtightly at a ceiling portion of the processing chamber 10. A space above the dielectric window 53 is covered with a shield box 51 that is a container made of a conductive material. A space surrounded by the dielectric window 53 and the shield box 51 becomes an antenna chamber 52 which accommodates antennas 541 and 542 for generating plasma. The shield box 51 arranged on the processing chamber 10 is grounded through the processing chamber 10.

Hereinafter, with reference to FIG. 2, description will be made on a configuration of a plasma generation unit including antennas 541 and 542 for converting a processing gas into plasma.

Figure 2:
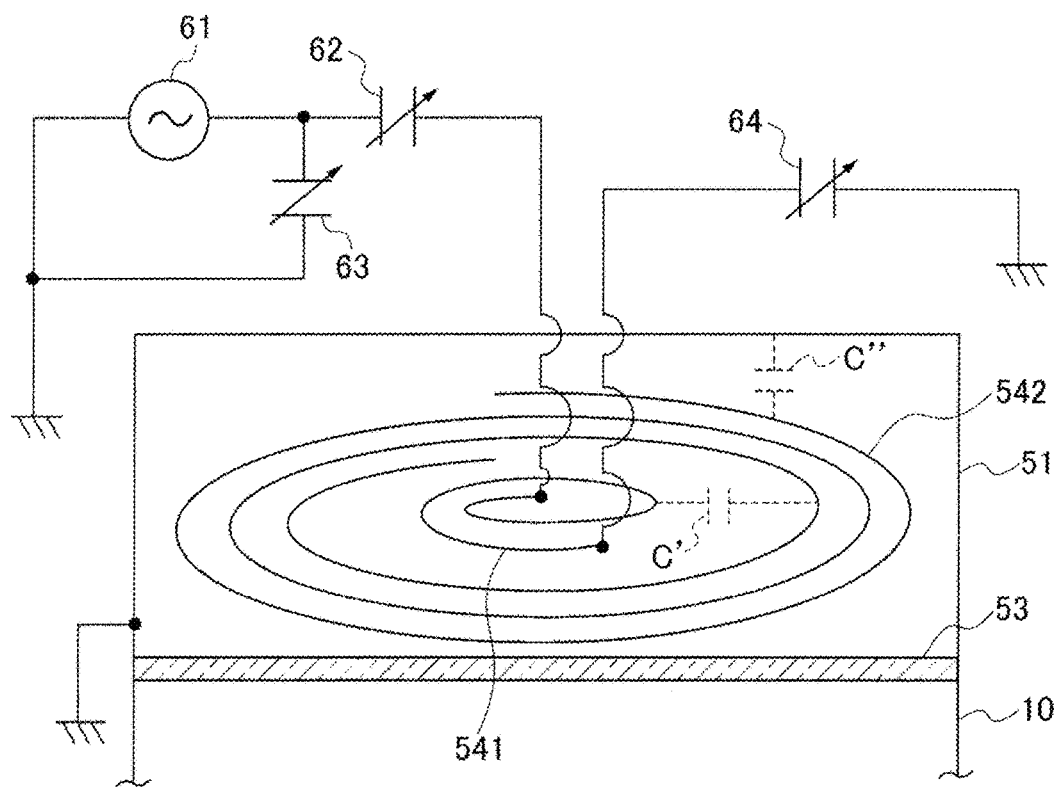
FIG. 2 is a schematic view of a plasma generation unit provided in the plasma processing apparatus.

An ICP (Inductively Coupled Plasma) antenna 541 that is a first high frequency antenna is formed of a planar vortex coil in which a conducting wire is wound in the same plane in a vortex shape (in FIG. 2, in a counterclockwise direction when viewed from above).

When a processing gas is supplied into the vacuum-exhausted processing chamber 10 and high frequency power is applied from a high frequency power supply 61 to the ICP antenna 541, a high frequency magnetic field is formed in the processing chamber 10 through the dielectric window 53. The processing gas is converted into plasma by a high frequency electric field induced by the formation of the magnetic field.

The high frequency power supply 61 capable of changing a frequency in a range of 0.1 to 100 MHz is connected to one end (e.g., an inner circumferential end) of the ICP antenna 541. A first variable capacitor 62 connected in series to the high frequency power supply 61 is provided between the high frequency power supply 61 and the ICP antenna 541. A second variable capacitor 63 connected in parallel to the high frequency power supply 61 is provided between a grounding terminal of the high frequency power supply 61 and the first variable capacitor 62.

The other end (e.g., an outer circumferential end) of the ICP antenna 541 is grounded through a third variable capacitor 64 that is a variable capacity for adjusting a resonant frequency to be later described.

The first to third variable capacitors 62 to 64 (variable capacitor group) constitute an impedance adjustment unit of the present embodiment.

Here, a winding direction of the vortex coil forming the ICP antenna 541 and positions of the end of the ICP antenna 541 to which the high frequency power supply 61 is connected and the end of the ICP antenna 541 which is grounded through the third variable capacitor 64 are not limited to the example described above. The ICP antenna 541 may be formed of a planar vortex coil wound in a counterclockwise direction when viewed from above. Further, the outer circumferential end may be connected to the high frequency power supply 61 and the inner circumferential end may be grounded through the third variable capacitor 64.

A power receiving antenna 542 that is a second high frequency antenna is arranged so as to surround the ICP antenna 541 at, e.g., the outer peripheral side of the ICP antenna 541.

Figure 3A:
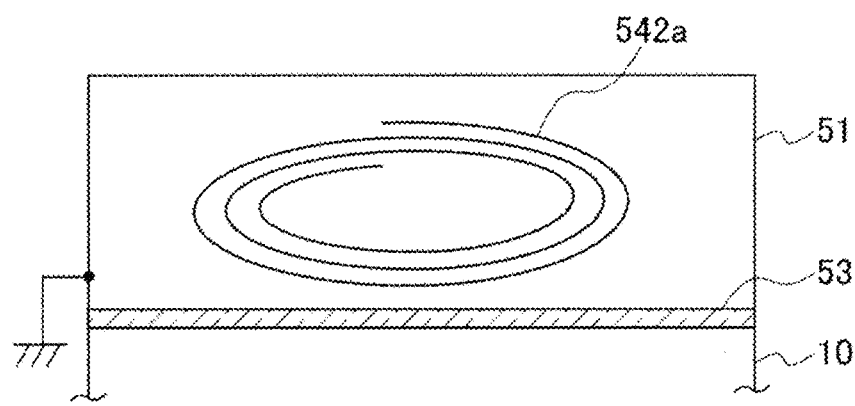
FIGS. 3A and 3B are explanatory views for an operation of a conventional plasma antenna.
Figure 3B:
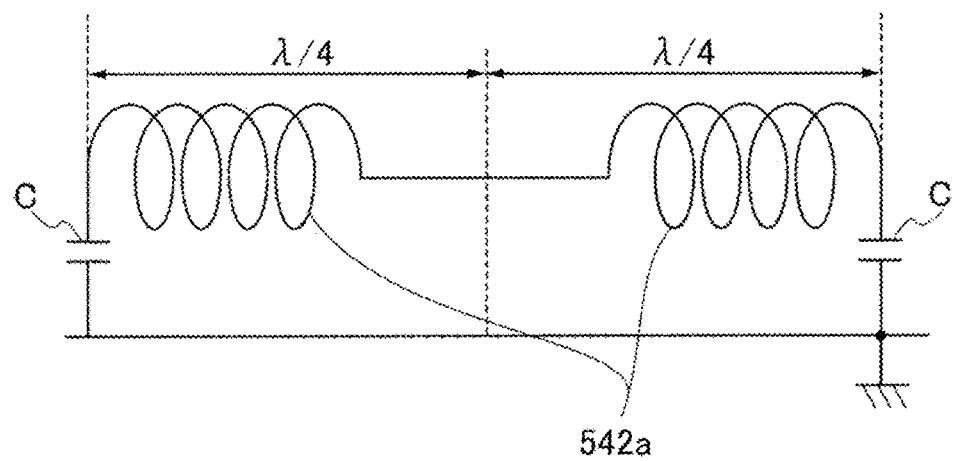

Conventionally, it is known that when arranging a plasma antenna 542a formed of a planar vortex coil in the grounded shield box 51 as shown in FIG. 3A and supplying high frequency power from a high frequency power supply (not shown) to the plasma antenna 542a, a capacity coupling C is formed between the plasma antenna 542a and the shield box 51 (refer to an equivalent circuit of FIG. 3B)

A circuit including the plasma antenna 542a and the capacity coupling C resonates at a frequency T corresponding to an antenna length ($\lambda/2$) and inductance of the plasma antenna 542a, and a capacitance of the capacity coupling C. Therefore, it can be used as an antenna for generating plasma. A resonant frequency of the circuit can be controlled by changing a distance between the plasma antenna 542a and the shield box 51. That is, the plasma antenna 542a has a natural resonant frequency under the condition that the antenna length and a distance to the shield box 51 are fixed.

In the plasma etching apparatus of the present embodiment, the power receiving antenna 542 that employs the plasma antenna 542a and is formed of a planar vortex coil in which a conducting wire is wound in a vortex shape (in FIG. 2, a clockwise direction when viewed from above which is the same as the ICP antenna 541) in the same plane is arranged at, e.g., the outer peripheral side of the ICP antenna 541 arranged in the shield box 51. One end and the other end (inner circumferential end and outer circumferential end) of the power receiving antenna 542 are open ends and are not directly connected to the high frequency power supply 61.

The present inventors have found that among the ICP antenna 541 and the power receiving antenna 542 arranged at the inner side and the outer side, when high frequency power is supplied to the ICP antenna 541 connected to the high frequency power supply 61, the high frequency power is distributed also to the power receiving antenna 542 and an ICP plasma corresponding to the power receiving antenna 542 is formed in the processing chamber 10.

In the plasma generation unit having the above-described configuration, it has been found that two different resonant frequencies (first and second resonant frequencies) appear when a frequency of the high frequency power supplied from the high frequency power supply 61 is changed by properly adjusting capacities of the first to third variable capacitors 62 to 64 forming the impedance adjustment unit (refer to test examples to be later described). Positions at which the resonant frequencies appear can be controlled by setting each capacity of the impedance adjustment unit. Additionally, there arises no restriction that one of the two resonant frequencies becomes a value equal to the natural resonant frequency of the plasma antenna 542a described with reference to FIG. 3.

As long as the positions at which the resonant frequencies appear can be controlled, the configuration of the impedance adjustment unit is not limited to the above-described example. For example, the other end of the ICP antenna 541 may be directly grounded without providing the third variable capacitor 64. In this case, a resonant frequency and reflectivity can be controlled by, e.g., using two variable capacitors 62 and 63 provided at the side of the high frequency power supply 61.

As another configuration example of the impedance adjustment unit, since a capacity between the power receiving antenna 542 and the shield box 51 is changed by changing a distance therebetween, the two resonant frequencies may be adjusted by changing the distance. In this case, the distance may be changed by providing a height adjustment mechanism for the power receiving antenna 542 including an elevating mechanism. Alternatively, a plate, which has an elevating mechanism and is electrically connected to the shield box 51, may be installed and a distance between the plate and the power receiving antenna 542 may be changed.

When a frequency difference between two resonant frequencies is small, if high frequency power near a resonant frequency of the ICP antenna 541 is supplied, the power distribution to the power receiving antenna 542 is increased. Further, when the frequency difference is large, the power distribution to the power receiving antenna 542 is decreased.

When using the characteristics of the ICP antenna 541 and the power receiving antenna 542 described above, it becomes possible to distribute the high frequency power to different high frequency antennas 541 and 542 by using only one high frequency power supply 61 and to form an ICP in the processing chamber 10. Further, the plasma density distribution can be controlled in the plane of the wafer W by changing the distribution of the high frequency power.

The detailed principle on the supply of the high frequency power from the ICP antenna 541 connected to the high frequency power supply 61 to the power receiving antenna 542 is not obvious. However, it is considered that the power supply may be performed by the formation of a capacity coupling C' between the ICP antenna 541 and the power receiving antenna 542 and a capacity coupling C" between the power receiving antenna 542 and the shield box 51 as virtually shown in FIG. 2, and by a principle of an electromagnetic field resonance in a wireless power supply. The power supply by the "electromagnetic field resonance" in the present embodiment includes a case where the power supply from the ICP antenna 541 to the power receiving antenna 542 is performed by a combination of the magnetic field resonance and the electric field resonance or by at least one of the magnetic field resonance and the electric field resonance.

Further, it is considered that two resonant frequencies appear by the formation of a power supply circuit running from the high frequency power supply 61 through the ICP antenna 541, the power receiving antenna 542 and the shield box 51 to the grounding terminal, in addition to a power supply circuit running from the high frequency power supply 61 through the ICP antenna 541 to the grounding terminal.

As will be described in test results, it is difficult to specify which one of the two resonant frequencies corresponds to which one of the two high frequency antennas 541 and 542.

As for a design variable of the power receiving antenna 542, there are an antenna length of the ICP antenna 541, a distance between the shield box 51 and the power receiving antenna 542, and a distance between the ICP antenna 541 and the power receiving antenna 542. By controlling these variables with respect to a design frequency (e.g., a center frequency to be later described) of high frequency power supplied to the ICP antenna 541, it is possible to provide the power receiving antenna 542 having, e.g., a natural resonant frequency that is close to the design frequency.

For example, in a case where a circuit including the ICP antenna 541 and the power receiving antenna 542 is designed to have a resonat frequency in a range of 12.56 to 14.56 MHz (13.56 MHz of the center frequency), the shortest distance between the ICP antenna 541 and the power receiving antenna 542 may be set to 3 to 20 mm, and the shortest distance between the power receiving antenna 542 and the shield box 51 may be set to 3 to 50 mm. Moreover, when a wavelength of the high frequency power at the center frequency (13.56 MHz) is indicated as λ, an antenna length of the power receiving antenna 542 becomes a value of λ/2 multiplied by a fractional shortening depending on the surrounding environment, e.g., becomes about 2 to 4 m, although the antenna length may depend on the number of turns of winding.

Then, it becomes possible to control the positions at which two resonat frequencies appear by adjusting each capacity of the first to third variable capacitors 62 to 64 (impedance adjustment unit). As an adjustment method of the variable capacitors 62 to 64, for example, there is a method in which reflection at the first and second variable capacitors 62 and 63 is controlled while changing a capacity of the third variable capacitor 64 to change a resonant frequency.

Returnning to the description on the plasma etching apparatus, as shown in FIG. 1, the plasma etching apparatus is connected to a control unit 7 which controls the entire operation of the plasma etching apparatus. The control unit 7 includes a computer having a CPU (central processing unit) (not shown) and a storage unit (not shown). The storage unit stores programs including step (command) groups for the operation of the plasma etching apparatus, i.e., operations such as loading and unloading of the wafer W into the processing chamber 10, a vacuum exhaust, adjustment of a processing gas supply amount, supply of the high frequency power from the high frequency power supply 61, a capacity setting of the impedance adjustment unit, and the like. The programs are stored in a storage medium, e.g., hard disk, compact disk, magnet optical disk, memory card or the like and are installed in the computer therefrom.

The operation of the plasma etching apparatus having the above configuration will be described.

When a wafer W to be processed is loaded into the processing chamber 10 through the loading/unloading port 101 by, e.g., a transfer arm in a vacuum transfer chamber provided adjacent to the processing chamber 10, the elevating pins (not shown) are raised to receive the wafer W from the transfer arm. When the transfer arm is withdrawn from the processing chamber 10, the gate valve 102 is closed and the elevating pins are lowered to mount the wafer W on the electrostatic chuck 23.

When a direct current power is supplied to the electrostatic chuck 23, the wafer W is held on the electrostatic chuck 23. At this time, a temperature-controlled coolant flows through the coolant path 212, a temperature of the wafer W is controlled through a heat transfer gas supplied from the gas supply line 214 to the backside of the wafer W. The inside of the processing chamber 10 is vacuum-exhausted through the exhaust port 12 by the vacuum exhaust mechanism 14.

If the inside of the processing chamber 10 becomes a predetermined pressure, a processing gas is supplied from the processing gas supply mechanism 44 into the processing chamber 10 while the vacuum-exhaust is continuously performed by the vacuum exhaust mechanism 14. Further, high frequency power is supplied from the high frequency power supply 61 to the ICP antenna 541. Furthermore, high frequency power for bias is supplied from the high frequency power supply 30 to the susceptor 21.

When the high frequency power is supplied to the ICP antenna 541, some of the power is distributed to the power receiving antenna 542, and ICP is formed under the ICP antenna 541 and the power receiving antenna 542 through the dielectric window 53.

At this time, a frequency of the high frequency power supplied from the high frequency power supply 61 to the ICP antenna 541 and capacities of the first to third variable capacitors 62 to 64 are previously set by a processing recipe and the like. Accordingly, under the ICP antenna 541 and the power receiving antenna 542, a desired plasma density distribution corresponding to the set values is formed, and further, density distribution of an active species such as ions of the processing gas and the like is formed corresponding to the plasma density distribution.

The active species thus obtained is attracted to the wafer W on the susceptor 21 by an act of the bias power and reaches the surface of the wafer W to perform an etching process. Since the supply density distribution of the active species is formed corresponding of the above plasma density distribution, the progress of the etching process can be controlled in the plane of the wafer W.

The plasma density distribution formed by the ICP antenna 541 and the power receiving antenna 542 is not limited to a case where the plasma density distribution is controlled to become non-uniform in the plane of the wafer W. For example, in a case where a plasma density of the ICP formed by using the ICP antenna 541 is non-uniform between the central side and peripheral side of the wafer W, the distribution of the high frequency power to the ICP antenna 541 and the power receiving antenna 542 may be controlled. BY doing so, the non-uniformity of the plasma density distribution by the ICP antenna 541 is resolved so that a uniform process in the plane of the wafer W can be performed.

After the etching process of the wafer W is performed for a predetermined period of time, the supply of the processing gas through the processing gas supply hole 42 and the supply of high frequency power from the high frequency power supplies 61 and 30 are stopped. Next, a pressure in the processing chamber 10 is controlled. Thereafter, the gate valve 102 is opened and in the reverse order to the loading of the wafer W, the transfer arm receives the processed wafer W to unload the wafer W from the processing chamber 10.

With the plasma etching apparatus (plasma processing apparatus) in accordance with to the present embodiment, the following effect is presented. A power is supplied to the ICP antenna (the first high frequency antenna) 541 and the power receiving antenna (the second high frequency antenna) 542 arranged together with the ICP antenna 541, and the power is controlled by the impedance adjustment unit such that the ICP antenna 541 and the power receiving antenna 542 have different resonant frequencies from each other. By doing so, distribution of the high frequency power supplied to the high frequency antennas 541 and 542 can be changed. As a result, the plasma density distribution formed in the processing chamber 10 is changed and thus the progress of processing the wafer W can be controlled in the plane of the wafer W.

Here, the arrangement relationship between the ICP antenna 541 and the power receiving antenna 542 is not limited to a case where the power receiving antenna 542 is arranged at the outer peripheral side of the ICP antenna 541.

Figure 4:
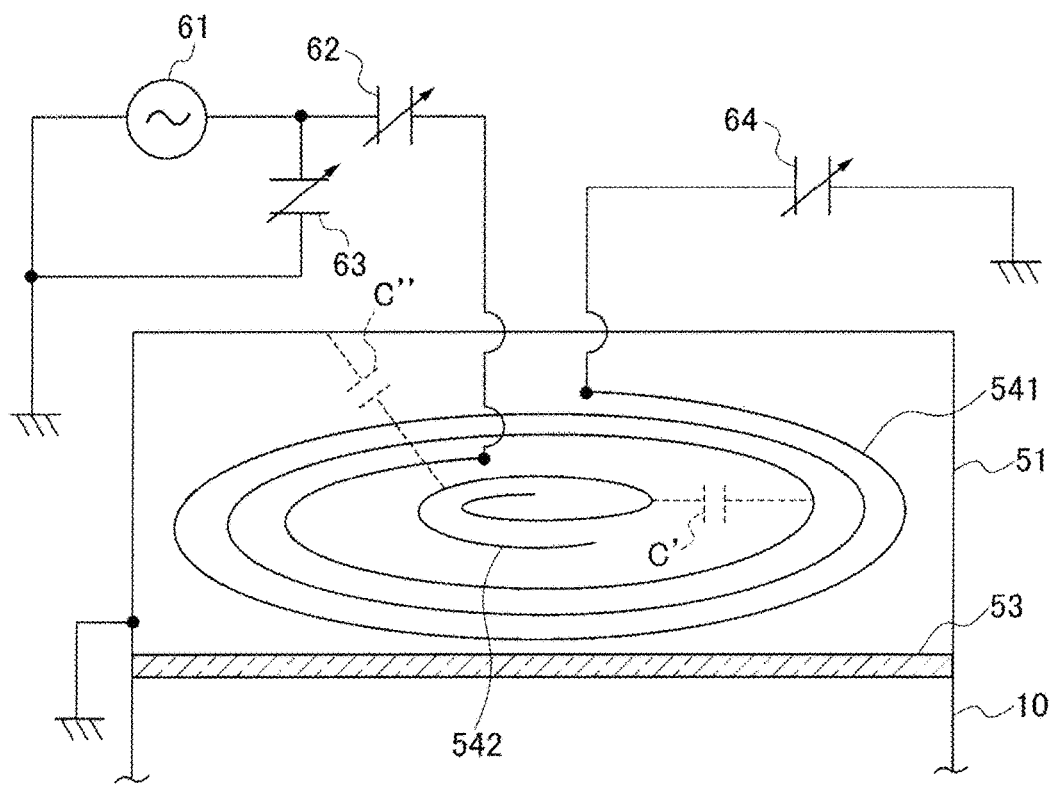
FIG. 4 is a schematic view showing a modified example of the plasma generation unit.

For example, as shown in FIG. 4, the ICP antenna 541 may be configured by connecting one end (e.g., inner circumferential end) of a vortex coil arranged at an outer peripheral side to the high frequency power supply 61 and grounding the other end thereof, and the power receiving antenna 542 may be configured by allowing both ends of a vortex coil arranged at an inner peripheral side to be open ends.

Also in this case, a capacity coupling C' and C" are formed between the ICP antenna 541 and the power receiving antenna 542 and between the power receiving antenna 542 and the shield box 51, respectively, which makes it possible to distribute high frequency power from the ICP antenna 541 to the power receiving antenna 542.

Figure 5:
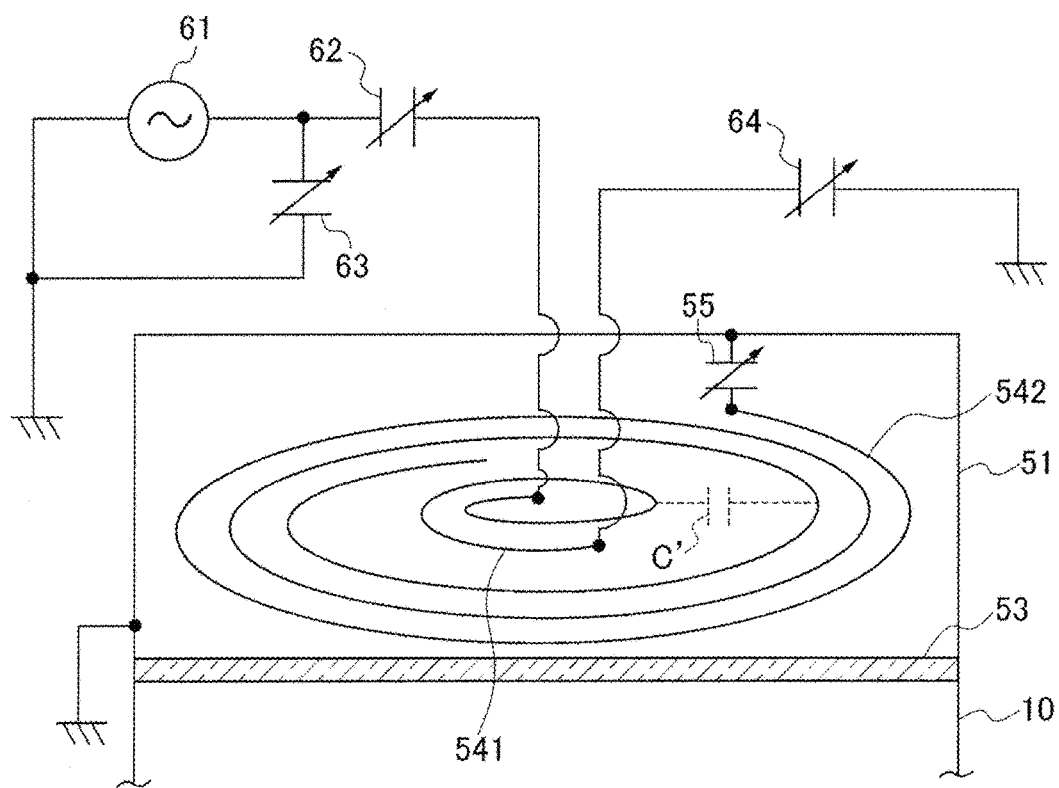
FIG. 5 is a schematic view of a plasma generation unit in accordance with another example.

In the plasma generation unit in which the power receiving antenna 542 is arranged at the outer peripheral side of the ICP antenna 541, FIG. 5 shows an example in which a resonant frequency of a power receiving circuit including the ICP antenna 541 is controlled by providing a fourth variable capacitor 55 between one end (e.g., outer circumferential end) of the power receiving antenna 542 and the shield box 51. In this case, for example, reflection at the first and second variable capacitors 62 and 63 can be controlled while changing a resonant frequency by changing capacities of the third and fourth variable capacitors 64 and 55.

Alternatively, a power distribution between the ICP antenna 541 and the power receiving antenna 542 may be controlled by a method in which a capacity of the fourth variable capacitor 55 is fixed, a resonant frequency of the side of the ICP antenna 541 is controlled by the third variable capacitor 64, and the first variable capacitor 62a is changed to change a circuit constant of the side of the high frequency power supply, thereby changing a resonant frequency of an entire system including the ICP antenna 541 and the power receiving antenna 542. In this case, the reflectivity is controlled by the second variable capacitor 63.

Figure 6:
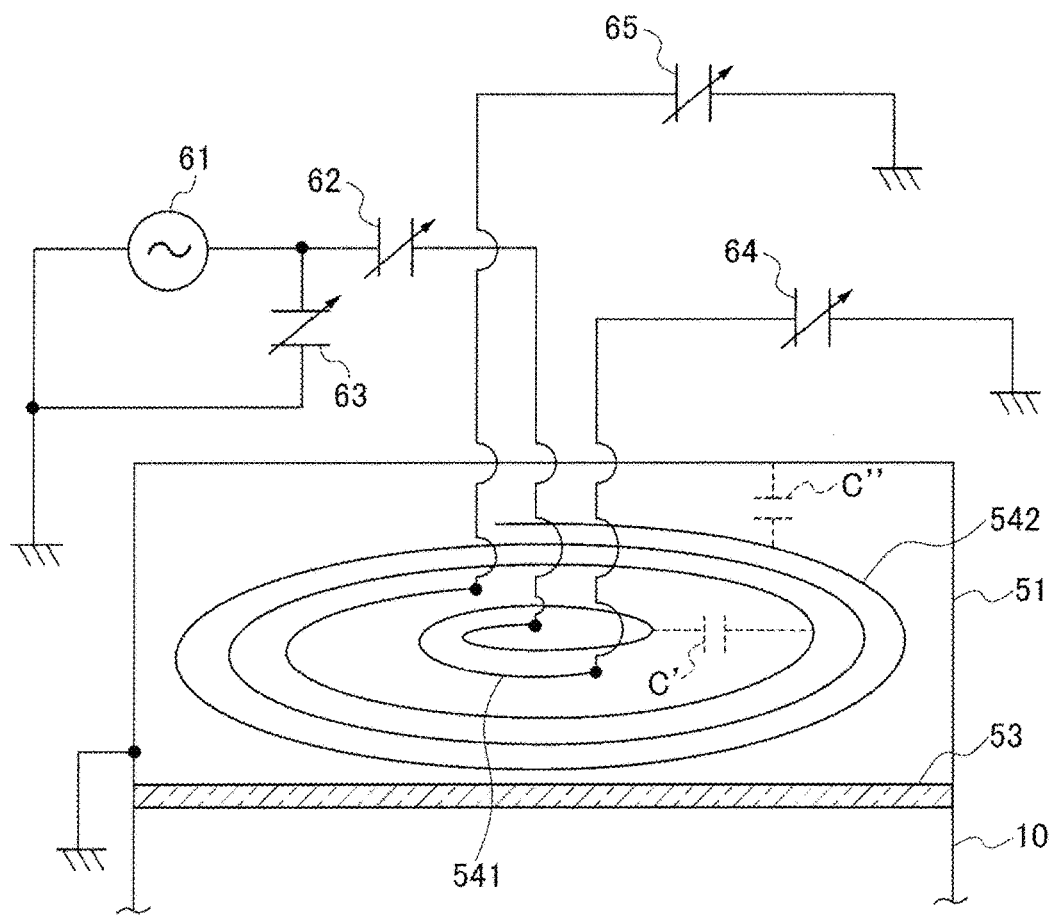
FIG. 6 is a schematic view of a plasma generation unit in accordance with still another example.

In the plasma generation unit in which the power receiving antenna 542 is arranged at the outer peripheral side of the ICP antenna 541, FIG. 6 shows an example in which one end (e.g., inner circumferential end) of the power receiving antenna 542 is grounded through a fifth variable capacitor 65. In this case, since a current does not flow in the one end of the power receiving antenna 542 that is short-circuited to the ground through the fifth variable capacitor 65, a plasma density becomes small at a central portion between the ICP antenna 541 and the power receiving antenna 542.

Figure 7:
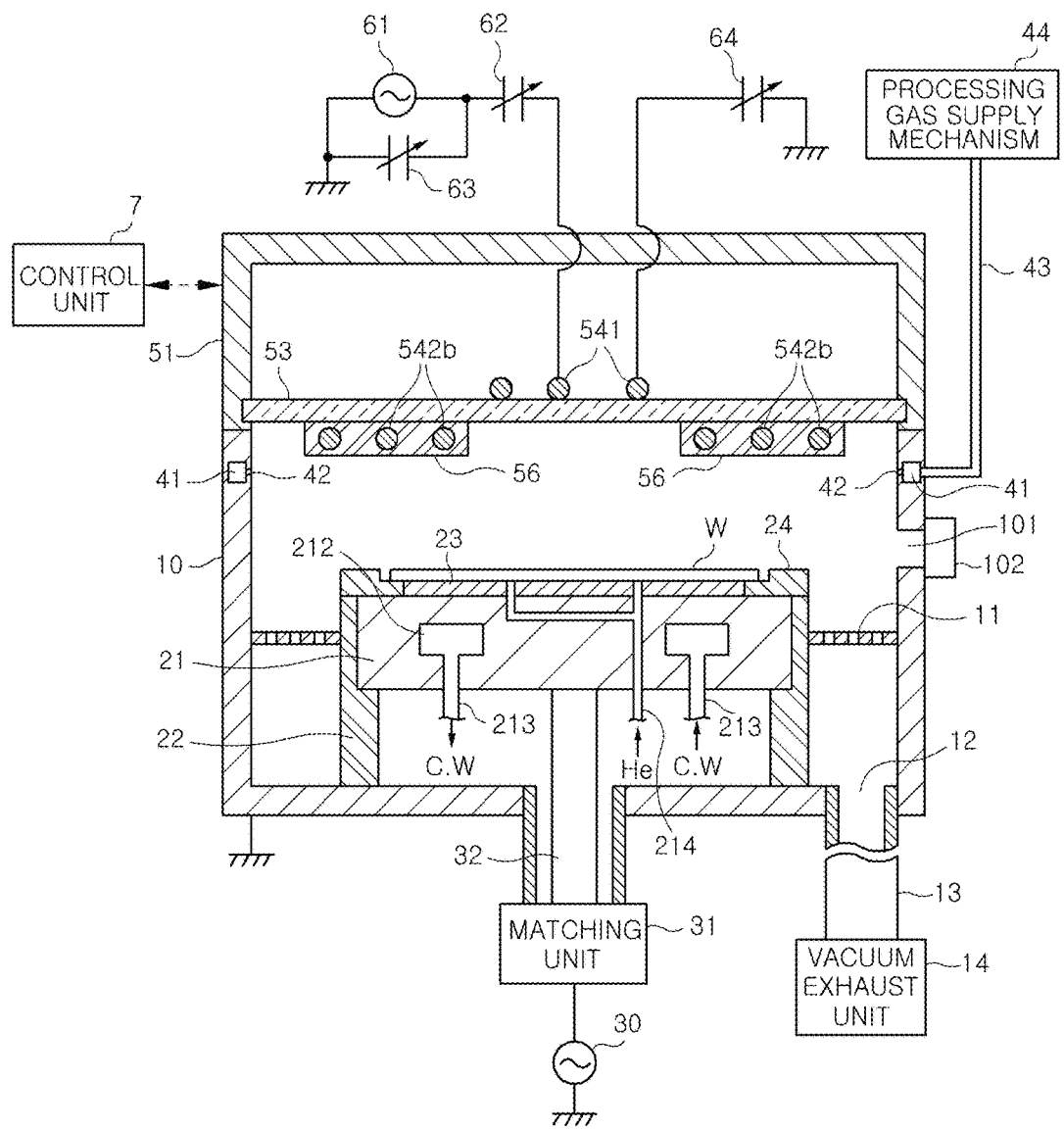
FIG. 7 is a vertical sectional side view of a plasma processing apparatus including a plasma generation unit in accordance with a second embodiment of the present invention.
Figure 8:
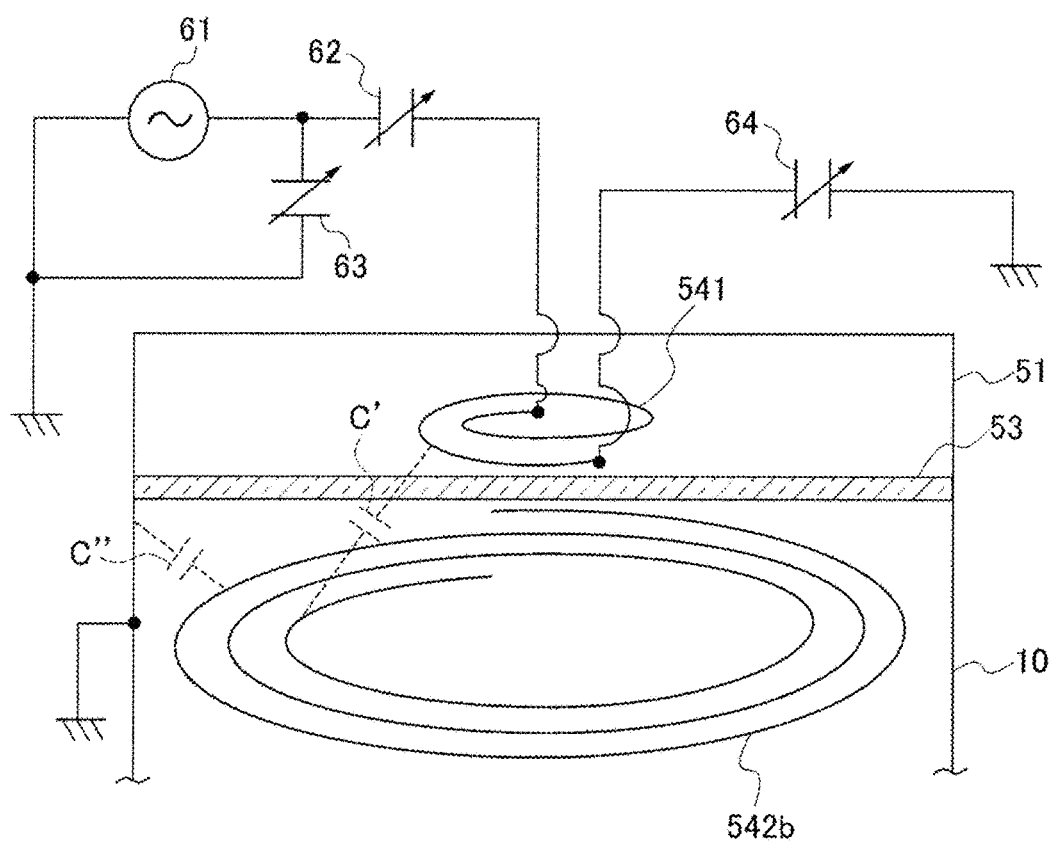
FIG. 8 is a schematic view of the plasma generation unit in accordance with the second embodiment.

Next, a configuration of a plasma etching apparatus in accordance with a second embodiment will be described with reference to FIGS. 7 and 8. In FIGS. 7 and 8, like parts as in FIGS. 1 to 6 are represented by like reference numerals.

In a plasma generation unit of the second embodiment, the ICP antenna 541 and a power receiving antenna 542b are arranged in different height positions and the power receiving antenna 542b is arranged in the processing chamber 10 under the dielectric window 53. This arrangement is different from that of the first embodiment in which the ICP antenna 541 and the power receiving antenna 542 are arranged in almost the same height positions in the same antenna chamber 52.

In this case, when the ICP antenna 541 is viewed from above, the power receiving antenna 542b is arranged at an outer peripheral side or inner peripheral side of the ICP antenna 541 (FIGS. 7 and 8 show an example in which the power receiving antenna 542b is arranged at an outer peripheral side of the ICP antenna 541). In a case where the height positions of the ICP antenna 541 and the power receiving antenna 542b are different from each other, a part of the ICP antenna 541 and a part of the power receiving antenna 542b may be overlapped when viewed from above.

A configuration of the power receiving antenna 542b is the same as that of the power receiving antenna 542 described with reference to FIG. 2. However, the power receiving antenna 542b may be preferably accommodated in a cover 56 made of a conductor such as aluminum, copper, carbon black or the like, a dielectric such as quartz, alumina or the like, or a resin such as fluorine resin, aromatic polyetherketone resin (e.g., PEEK (polyetheretherketone)) or the like.

For example, in a case of using the cover 56 made of a dielectric or a resin, a groove corresponding to the shape of the power receiving antenna 542b is made in the cover 56 having an annular disk shape capable of accommodating the power receiving antenna 542b, and the power receiving antenna 542b is accommodated in the groove, and then a top surface of the power receiving antenna 542b is covered with a resin or the like. Further, in a case of using the cover 56 made of a conductor, a resin is filled up in the annular disk-shaped cover having a hollow inside and the power receiving antenna 542b is arranged in the resin. Additionally, the cover 56 made of a conductor needs to be grounded.

If a gap exists between conducting wires of the power receiving antenna 542b arranged in the processing chamber 10, an abnormal discharge may occur at a point having a high potential. The occurrence of the abnormal discharge can be suppressed by filling the gap.

Also in a case where the power receiving antenna 542b is arranged in the processing chamber 10, as shown in FIG. 8, a capacity coupling C' is formed between the ICP antenna 541 and the power receiving antenna 542b and a capacity coupling C" is formed between the power receiving antenna 542b and the processing chamber 10, and two resonant frequencies appear. Further, the high frequency power can be distributed from the ICP antenna 541 to the power receiving antenna 542b (refer to a test example which will be later described).

In the example shown in FIG. 8, the metallic processing chamber 10 that is grounded and capacity-coupled with the power receiving antenna 542b can shield electromagnetic waves radiated from the power receiving antenna 542b. Therefore, the processing chamber 10 may form a part of the shield box 51. Additionally, the illustration of the cover 56 is omitted in FIG. 8.

In the embodiments described with reference to FIGS. 1, 2 and 4 to 8, the ICP antenna 541 and the power receiving antennas 542 and 542b are formed by a planar vortex coil. However, the vortex coil forming the antennas 541, 542 and 542b is not limited to the planar shape. For example, a vortex coil having a helix shape extending in an axial direction may be used as the ICP antenna 541 and the power receiving antennas 542 and 542b.

In the embodiments with reference to FIGS. 1 and 7, the plasma generation unit of the present invention has been applied to the plasma etching apparatus. However, the plasma processing apparatus to which the plasma generation unit is applicable is not limited to the plasma etching apparatus. For example, the plasma generation unit of the present invention can be applied to a plasma asking apparatus which removes a resist film formed on a wafer W by activating a processing gas such as oxygen gas or the like by using plasma, a plasma film forming apparatus which forms a film by CVD (chemical vapor deposition) or ALD (atomic layer deposition) by reacting a film forming gas (processing gas) activated by plasma on the surface of a wafer W, and the like.

(Test Example)
(Test 1)
A resonanct frequency was examined by changing a frequency of the high frequency power supplied from the high frequency power supply 61 by using the plasma generation unit described with reference to FIGS. 1 and 2.

A. Test Condition

There were used the ICP antenna 541 that has two turns of winding and the power receiving antenna 542 that has a resonant frequency of 27 MHz and five turns of winding. The ICP antenna 541 and the power receiving antenna 542 were arranged at the same height positions in the shield box 51.

Under the condition that the capacities of the first to third variable capacitors 62 to 64 were fixed, reflectivity viewed from the high frequency power supply 61 were measured while changing a frequency of the high frequency power supplied from the high frequency power supply 61 in a range of 10 to 60 MHz.

B. Test Result

Figure 9:
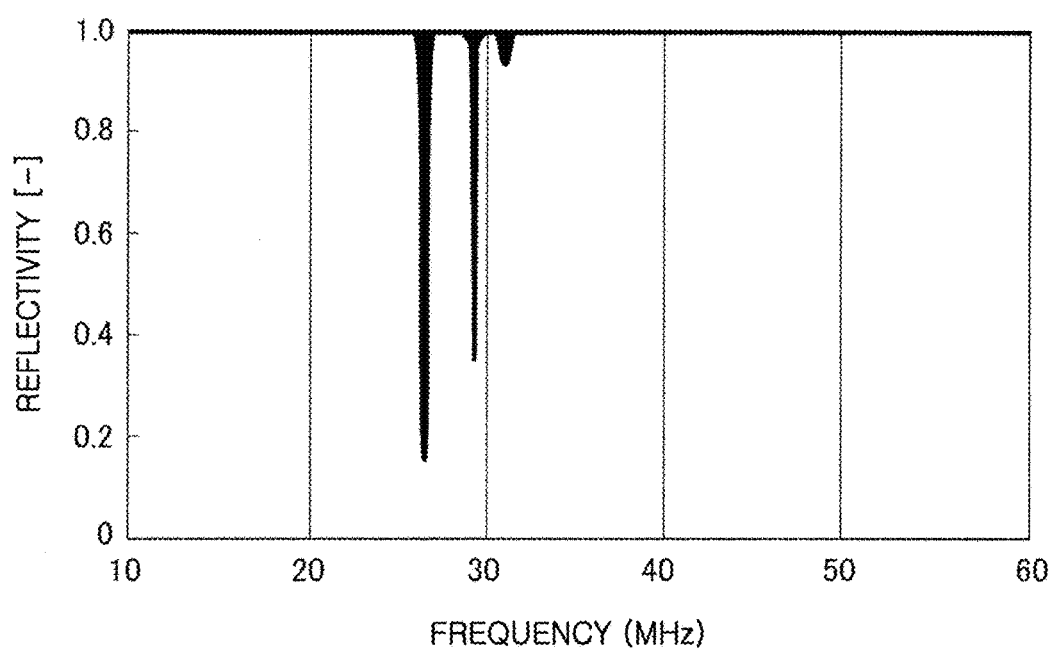
FIG. 9 is a graph showing a frequency characteristic of the plasma generation unit in accordance with the first embodiment.

The test result is shown in FIG. 9. In a graph of FIG. 9, the horizontal axis indicates a frequency of the high frequency power and the vertical axis indicates a reflectivity of the high frequency power viewed from the high frequency power supply 61. According to FIG. 9, frequencies at which the reflectivity is sharply reduced were observed at two portions near 27 MHz that is the resonant frequency of the power receiving antenna 542. The obsereved frequencies are resonant frequencies of a circuit including the ICP antenna 541 and the power receiving antenna 542. The positions at which the resonant frequencies are generated vary depending on the capacities of the variable capacitors 62 to 64. It is difficult to specify which resonant frequency corresponds to which one of the two high frequency antennas 541 and 542. A small reduction of the reflectivity presented in a higher frequency region than 30 MHz is considered caused by an effect of resonance between fixed parameters in a peripheral circuit and is negligible in view of ICP formation which uses the ICP antenna 541 and the power receiving antenna 542.

(Test 2)

A state of the ICP formed by the ICP antenna 541 and the power receiving antenna 542 was observed while changing the capacity of the third variable capacitor 64 by using the plasma generation unit which is the same as in the test 1.

A. Test Condition

A state of plasma was observed while gradually increasing a capacity value Ce of the third variable capacitor 64 and while controlling a frequency of the high frequency power supplied from the high frequency power supply 61, a capacity value C2 of the first variable capacitor 62 and a capacity value C1 of the second variable capacitor 63 so as to reduce the reflectivity viewed from the high frequency power supply 61. The observation of the plasma state was performed by a measurement of plasma density distribution and photography (visual observation).

B. Test Result

Figure 10:
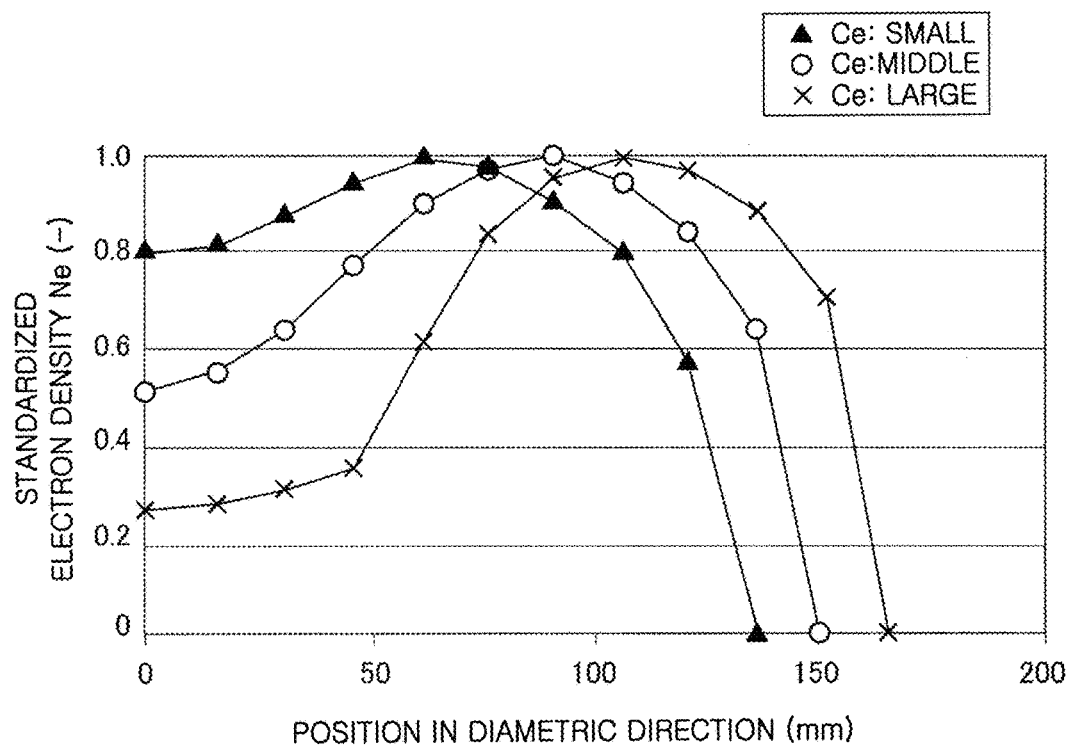
FIG. 10 is an explanatory view showing a density distribution of plasma generated by using the plasma generation unit in accordance with the first embodiment.
Figure 11A:
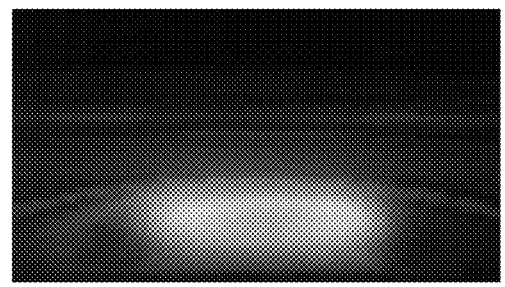
FIGS. 11A to 11C are explanatory views showing states of plasma generated by using the plasma generation unit in accordance with the first embodiment.
Figure 11B:
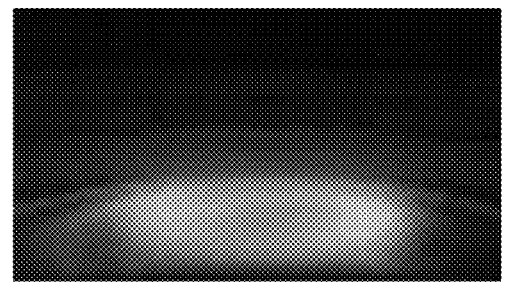
Figure 11C:
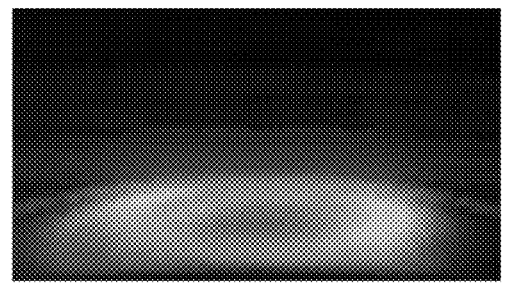

FIG. 10 shows plasma density distribution viewed in a diametric direction of the wafer W. In FIG. 10, the horizontal axis indicates a distance in the diametric direction from a position corresponding to the center of the wafer W, and the vertical axis indicates a value of an electron density Ne standardized by a maximum value NeMax of the electron density. In FIG. 10, the capacity value Ce is the smallest at black triangle plots, middle at white circle plots and the largest at X plots. In photographs of FIGS. 11A to 11C, FIG. 11A represents when the capacity value Ce is the smallest, FIG. 11B represents when the capacity value Ce is middle, and FIG. 11C represents when the capacity value Ce is the largest. A test condition such as the capacity value Ce of the third variable capacitor 64 and the like is not the same between FIG. 10 and FIGS. 11A to 11C.

According to the result shown in FIG. 10, as the capacity value Ce of the third variable capacitor 64 is increased, a region having a high standardized electron density moves toward the periphery of the wafer W whereas the standardized electron density gradually becomes smaller in the central portion of the wafer W. This tendency is also observed in a result of the photography. It is also found that as the capacity value Ce of the third variable capacitor 64 is increased, a plasma emitting region moves toward the periphery of the wafer W whereas plasma in the central portion of the wafer W is weakened (darkened).

As such, when using the plasma generation unit formed of a circuit including the ICP antenna 541 and the power receiving antenna 542 and having two resonant frequencies, it becomes possible to control the plasma density distribution even if only one high frequency power supply 61 is provided.

(Test 3)

A resonant frequency was examined while changing a frequency of the high frequency power supplied from the high frequency power supply 61 by using the plasma generation unit described with reference to FIG. 5.

A. Test Condition

The ICP antenna 541 and the power receiving antenna 542 having the same configurations as those in the test 1 were used. The capacity value C2 of the first variable capacitor 62 was set to 66 pF, and the capacity value C1 of the second variable capacitor 63 was set to 77 pF. The capacity value Ce of the third variable capacitor 64 and a capacity value Ch of the fourth variable capacitor 55 were respectively set to predetermined fixed values. The reflectivity viewed from the high frequency power supply 61 was observed while changing a frequency of the high frequency power supplied from the high frequency power supply 61 in a range of 10 to 70 MHz.

B. Test Result

Figure 12:
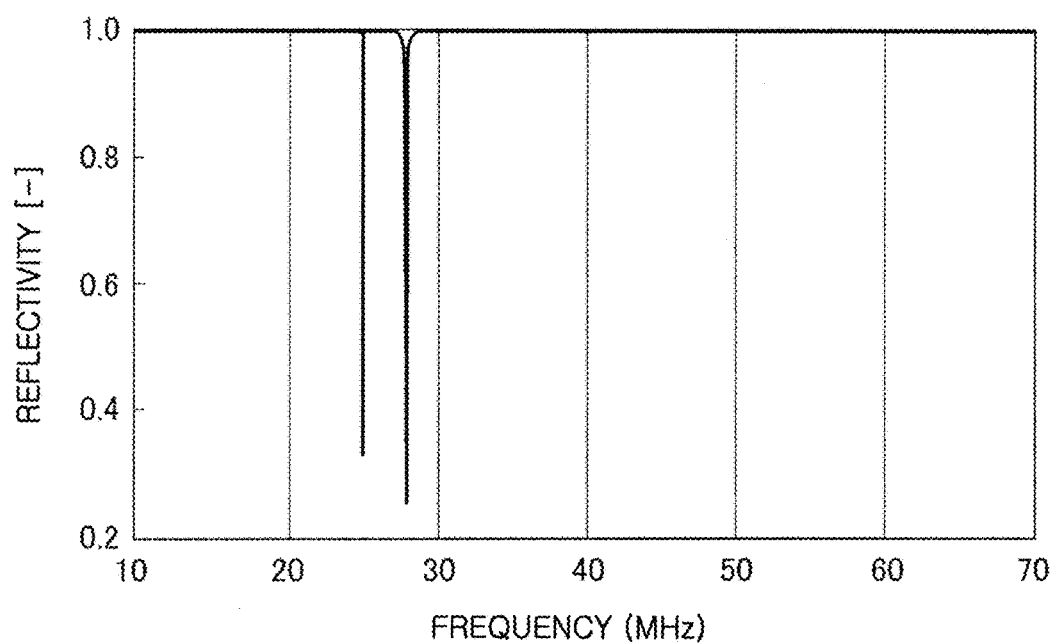
FIG. 12 is a graph showing a frequency characteristic of the plasma generation unit in accordance with the another example.

The test result is shown in FIG. 12. In a graph of FIG. 12, the horizontal axis and the vertical axis indicate the same parameters as those in FIG. 9. Also in the case where the fourth variable capacitor 55 was provided between the power receiving antenna 542 and the shield box 51, two resonant frequencies were observed at positions near 27 MHz that is the resonant frequency of the power receiving antenna 542.

(Test 4)

A state of the ICP formed by the ICP antenna 541 and the power receiving antenna 542 was observed while changing the capacity of the first variable capacitor 62 by using the plasma generation unit which is the same as in the test 3.

A. Test Condition

The capacity value Ce of the third variable capacitor 64 was fixed, and the capacity value C2 of the first variable capacitor 62 was gradually decreased. Further, a frequency of the high frequency power supplied from the high frequency power supply 61 and the capacity value C1 of the second variable capacitor 63 were controlled so as to reduce the reflectivity viewed from the high frequency power supply 61. Under this condition, a state of plasma was observed. An observation method of the plasma state is the same as in the test 2.

B. Test Result

Figure 13:
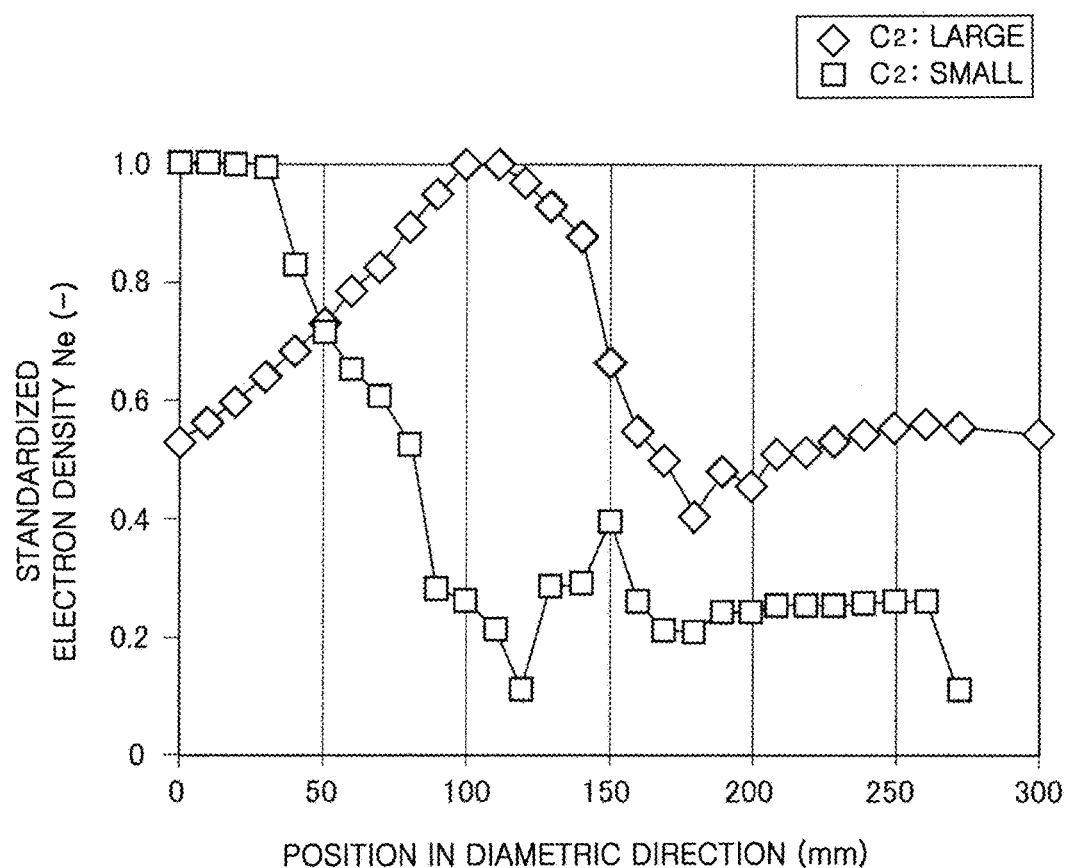
FIG. 13 is an explanatory view showing a density distribution of plasma generated by using the plasma generation unit in accordance with the another example.
Figure 14A:
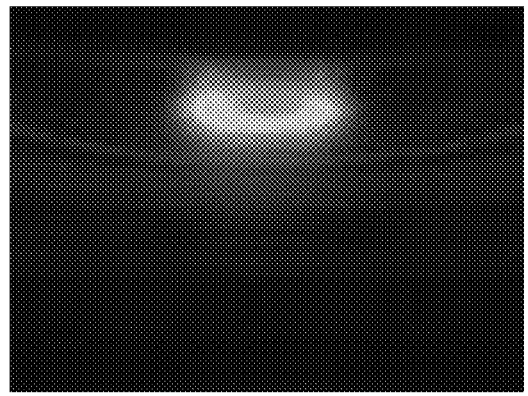
FIGS. 14A and 14B are explanatory views showing states of plasma generated by using the plasma generation unit in accordance with the another example.
Figure 14B:
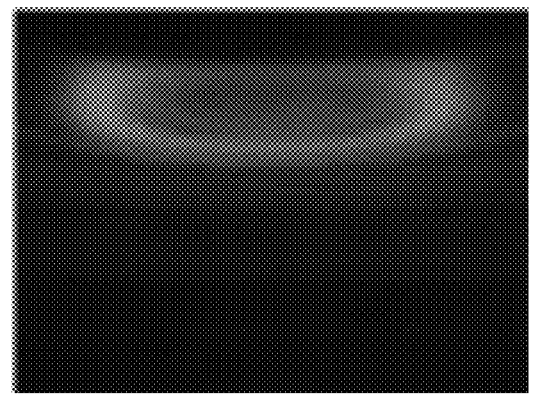

FIG. 13 shows plasma density distribution viewed in a diametric direction of the wafer W. In a graph of FIG. 13, the horizontal axis and the vertical axis indicate the same parameters as those in FIG. 10. In FIG. 13, white rhombus plots indicate that the capacity value C2 is large (C2: 67 pF), and white square plots indicate that the capacity value C2 is small (C2: 56 pF). In photographs of FIGS. 14A and 14B, FIG. 14A represents when the capacity value C2 is small and FIG. 14B represents when the capacity value C2 is large. A test condition such as the capacity value C2 of the first variable capacitor 62, the capacity value C1 of the second variable capacitor 63, and the like is not the same between FIG. 13 and FIGS. 14A and 14B.

According to the result shown in FIG. 13, in a case where the capacity value Ce of the third variable capacitor 64 is fixed, as the capacity value C2 of the first variable capacitor 62 is increased, a region having a high standardized electron density moves toward the periphery of the wafer W whereas the standardized electron density gradually becomes smaller in the central portion of the wafer W. This tendency is also observed in a result of the photography. It is also found that as the capacity value C2 of the first variable capacitor 62 is increased, a plasma emitting region moves toward the periphery of the wafer W whereas plasma in the central portion of the wafer W is weakened (darkened).

As such, also in the example where the fourth variable capacitor 55 is provided between the power receiving antenna 542 and the shield box 51, when using the plasma generation unit formed of a circuit including the ICP antenna 541 and the power receiving antenna 542 and having two resonant frequencies, it becomes possible to control the plasma density distribution even if only one high frequency power supply 61 is provided.

(Test 5)

A resonant frequency was examined while changing a frequency of the high frequency power supplied from the high frequency power supply 61 by using the plasma generation unit described with reference to FIGS. 7 and 8.

A. Test Condition

The ICP antenna 541 and the power receiving antenna 542b having the same configuration as those in the test 1 were used. The capacities of the first to third variable capacitors 62 to 64 were respectively fixed to predetermined values. The reflectivity viewed from the high frequency power supply 61 was observed while changing a frequency of the high frequency power supplied from the high frequency power supply 61 in a range of 10 to 60 MHz. Herein, the dielectric window 53 was a quartz plate, and the power receiving antenna 542b was accommodated in the cover 56 made of quartz.

B. Test Result

Figure 15:
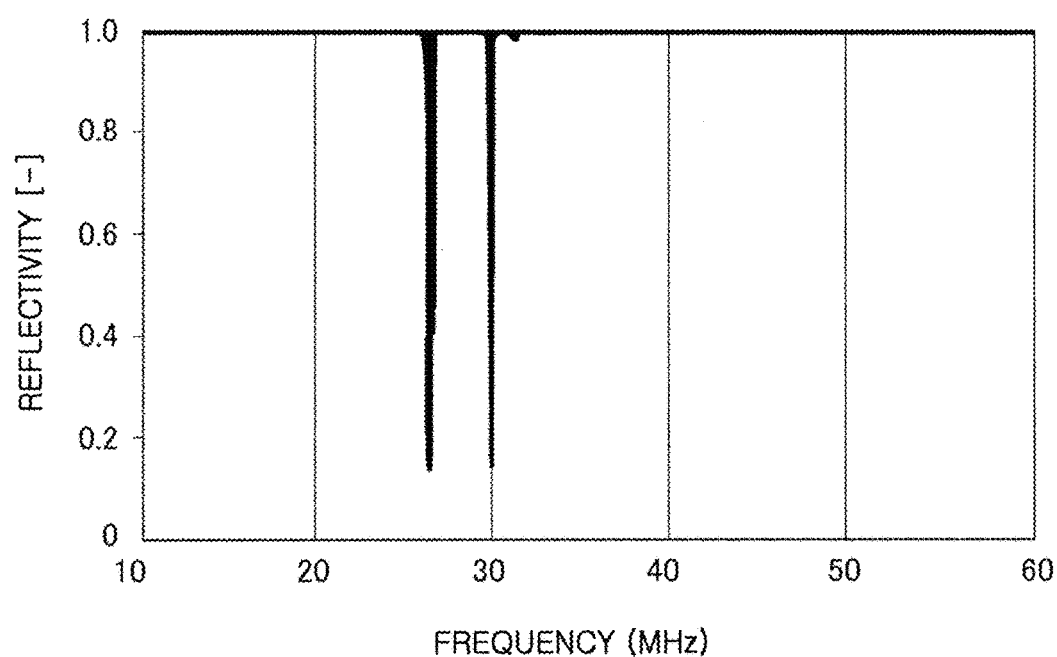
FIG. 15 is a graph showing a frequency characteristic of the plasma generation unit in accordance with the second embodiment.

The test result is shown in FIG. 15. In a graph of FIG. 15, the horizontal axis and the vertical axis indicate the same parameters as those in FIG. 9. Also in the case where the dielectric window 53 was interposed between the ICP antenna 541 and the power receiving antenna 542b, two resonant frequencies were observed at positions near 27 MHz that is the resonant frequency of the power receiving antenna 542b.

(Test 6)

A state of the ICP formed by the ICP antenna 541 and the power receiving antenna 542b was observed by using the plasma generation unit which is the same as in the test 5.

A. Test Condition

A capacity value Ce of the third variable capacitor 64 was set to a predetermined value and a capacity value C2 of the first variable capacitor 62 and a capacity value C1 of the second variable capacitor 63 were controlled so as to reduce the reflectivity viewed from the high frequency power supply 61. Under this condition, a state of plasma was observed. The observation of the plasma state was performed by photography (visual observation).

B. Test Result

Figure 16:
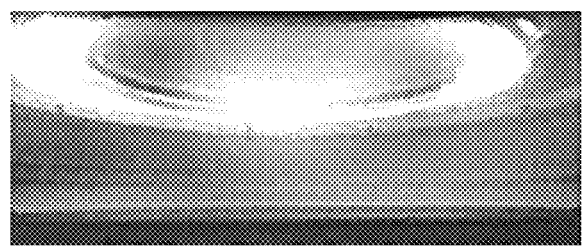
FIG. 16 is an explanatory view showing a state of plasma generated by using the plasma generation unit in accordance with the second embodiment.

The test result is shown in FIG. 16. According to the photograph shown in FIG. 16, even in the case where the dielectric window 53 is interposed between the ICP antenna 541 and the power receiving antenna 542b, when using the plasma generation unit formed of a circuit having two resonant frequencies, it becomes possible to generate plasma corresponding to the positions at which the ICP antenna 541 and the power receiving antenna 542b are arranged even if only one high frequency power supply 61 is provided.

While the invention has been shown and described with respect to the embodiments, it will be understood by those skilled in the art that various changes and modifications may be made without departing from the scope of the invention as defined in the following claims.

What is claimed is:

1. A plasma processing apparatus for performing a plasma process on a substrate in a processing chamber, the plasma processing apparatus comprising:
a mounting table disposed in the processing chamber and configured to mount the substrate;
a processing gas supply unit configured to supply a processing gas into the processing chamber;
an exhaust unit configured to vacuum-exhaust the processing chamber; and
a plasma generation unit arranged opposite to the mounting table and configured to convert the processing gas supplied into the processing chamber into plasma by inductive coupling;
wherein the plasma generation unit comprises:
a first high frequency antenna formed of a first vortex coil arranged adjacent to the processing chamber through a dielectric window, a first end of the first high frequency antenna being coupled to a high frequency power supply and a second end thereof being directly grounded or grounded through a capacitor;
a second high frequency antenna formed of a second vortex coil arranged at an outer peripheral side or an inner peripheral side of the first high frequency antenna, wherein the second high frequency antenna has two ends disposed respectively in an inner turn of the second vortex coil and an outer turn of the second vortex coil, and wherein further a first end and a second end of the second high frequency antenna are not physically coupled to any conductive device or at least one of the first end and the second end of the second high frequency antenna is grounded while a corresponding opposite end thereof is not physically coupled to any conductive device, and wherein when high frequency power is supplied to the first high frequency antenna coupled to the high frequency power supply, the high frequency power is distributed to the second high frequency antenna; and
a shield member that surrounds a space where the first high frequency antenna is arranged; and
an impedance adjustment unit coupled to the first high frequency antenna, and configured to control plasma density distribution of plasma generated by the plasma generation unit by changing distribution of the high frequency power between the first high frequency antenna and the second high frequency antenna.

2. The plasma processing apparatus of claim 1, wherein the impedance adjustment unit includes a variable capacitor group.

3. The plasma processing apparatus of claim 1, wherein by a capacity coupling between the second high frequency antenna and the shield member that is grounded, a power supply circuit is formed between the high frequency power supply, the first high frequency antenna and the second high frequency antenna.

4. The plasma processing apparatus of claim 2, wherein by a capacity coupling between the second high frequency antenna and the shield member that is grounded, a power supply circuit is formed between the high frequency power supply, the first high frequency antenna and the second high frequency antenna.

5. The plasma processing apparatus of claim 1, wherein the first end of the second high frequency antenna is grounded through a variable capacitor and a power supply circuit is formed between the high frequency power supply, the first high frequency antenna and the second high frequency antenna.

6. The plasma processing apparatus of claim 2, wherein the first end of the second high frequency antenna is grounded through a variable capacitor and a power supply circuit is formed between the high frequency power supply, the first high frequency antenna and the second high frequency antenna.

7. The plasma processing apparatus of claim 1, wherein the first end of the second high frequency antenna is grounded through a variable capacitor and the shield member, and a power supply circuit is formed between the high frequency power supply, the first high frequency antenna and the second high frequency antenna.

8. The plasma processing apparatus of claim 2, wherein the first end of the second high frequency antenna is grounded through a variable capacitor and the shield member, and a power supply circuit is formed between the high frequency power supply, the first high frequency antenna and the second high frequency antenna.

9. The plasma processing apparatus of claim 1, wherein the processing chamber forms a part of the shield member, and the second high frequency antenna is disposed in the processing chamber.

10. The plasma processing apparatus of claim 2, wherein the processing chamber forms a part of the shield member, and the second high frequency antenna is disposed in the processing chamber.

11. The plasma processing apparatus of claim 3, wherein the processing chamber forms a part of the shield member, and the second high frequency antenna is disposed in the processing chamber.

12. The plasma processing apparatus of claim 4, wherein the processing chamber forms a part of the shield member, and the second high frequency antenna is disposed in the processing chamber.

13. The plasma processing apparatus of claim 9, wherein the second high frequency antenna is covered with a cover made of a dielectric material, a conductor material, or a resin material.

14. The plasma processing apparatus of claim 10, wherein the second high frequency antenna is covered with a cover made of a dielectric material, a conductor material, or a resin material.

15. The plasma processing apparatus of claim 11, wherein the second high frequency antenna is covered with a cover made of a dielectric material, a conductor material, or a resin material.

16. The plasma processing apparatus of claim 12, wherein the second high frequency antenna is covered with a cover made of a dielectric material, a conductor material, or a resin material.

17. The plasma processing apparatus of claim 13, wherein an inside of the cover is filled with a filling material to fill a gap between conducting wires of the second high frequency antenna.

18. The plasma processing apparatus of claim 14, wherein an inside of the cover is filled with a filling material to fill a gap between conducting wires of the second high frequency antenna.

19. The plasma processing apparatus of claim 15, wherein an inside of the cover is filled with a filling material to fill a gap between conducting wires of the second high frequency antenna.

20. The plasma processing apparatus of claim 16, wherein an inside of the cover is filled with a filling material to fill a gap between conducting wires of the second high frequency antenna.

21. The plasma processing apparatus of claim 1, wherein a capacity coupling is formed between the first high frequency antenna and the second high frequency antenna.

22. The plasma processing apparatus of claim 1, wherein the first high frequency antenna and the second high frequency antenna in combination are operable to result in two resonant frequencies with reference to a circuit viewed from the high frequency power supply toward the first high frequency antenna.

23. The plasma processing apparatus of claim 22, wherein the impedance adjustment unit comprises a variable capacitor configured to adjust a resonant frequency of the circuit viewed from the high frequency power supply toward the first high frequency antenna, and wherein the circuit is configured to have a first resonant frequency and a second resonant frequency depending on adjustment of the impedance adjustment unit when an output frequency of high frequency power supplied from the high frequency power supply is changed.

* * * * *